US009947281B2

(12) United States Patent
Wang

(10) Patent No.: US 9,947,281 B2
(45) Date of Patent: Apr. 17, 2018

(54) SHIFT REGISTER UNIT, GATE DRIVE DEVICE AND DISPLAY DEVICE

(71) Applicants: Boe Technology Group Co., Ltd., Beijing (CN); Beijing Boe Display Technology Co., Ltd., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/913,331

(22) PCT Filed: Aug. 4, 2015

(86) PCT No.: PCT/CN2015/085993
§ 371 (c)(1),
(2) Date: Feb. 19, 2016

(87) PCT Pub. No.: WO2016/161726
PCT Pub. Date: Oct. 13, 2016

(65) Prior Publication Data
US 2017/0186393 A1    Jun. 29, 2017

(30) Foreign Application Priority Data

Apr. 9, 2015 (CN) .......................... 2015 1 0165116

(51) Int. Cl.
G09G 3/36 (2006.01)
G11C 19/18 (2006.01)

(52) U.S. Cl.
CPC ......... *G09G 3/3677* (2013.01); *G11C 19/184* (2013.01); *G09G 2300/0809* (2013.01); *G09G 2310/0286* (2013.01)

(58) Field of Classification Search
CPC ... G09G 2300/0809; G09G 2310/0286; G09G 3/3677; G11C 19/184
See application file for complete search history.

(56) References Cited

U.S. PATENT DOCUMENTS 8,018,451 B2 * 9/2011 Park ..................... G09G 3/3677
345/100
8,310,432 B2 * 11/2012 Lee ...................... G09G 3/3677
345/100

(Continued)

FOREIGN PATENT DOCUMENTS

CN      102650751      8/2012
CN      102654986      9/2012

(Continued)

OTHER PUBLICATIONS

International Search Report and Written Opinion from PCT/CN15/85993 dated Jan. 5, 2016.

*Primary Examiner* — Afroza Chowdhury
(74) *Attorney, Agent, or Firm* — Calfee, Halter & Griswold LLP

(57) ABSTRACT

The present disclosure provides a shift register unit including a pull-up module, an input module, a pull-down control module, a pull-down module, a reset discharging module, a voltage dividing module, a holding module, and a far end pull-down module. The shift register unit is designed in a split manner in order to perform pull-down compensation to the output signal at the far end, saving the low voltage signal at the far end, thereby saving the space and facilitating the design. The present disclosure further provides a gate driving device and a display device using the shift register unit.

16 Claims, 4 Drawing Sheets

(56) References Cited

U.S. PATENT DOCUMENTS 8,610,655 B2 * 12/2013 Yoon .................... G09G 3/3677
345/98
2010/0026669 A1 2/2010 Lee et al.

FOREIGN PATENT DOCUMENTS

| CN | 202502720 | 10/2012 |
| CN | 104252853 | 12/2014 |
| CN | 104464600 | 3/2015 |
| CN | 104700814 | 6/2015 |

* cited by examiner

SHIFT REGISTER UNIT, GATE DRIVE DEVICE AND DISPLAY DEVICE

RELATED APPLICATIONS

The present application is the U.S. national phase entry of PCT/CN2015/085993 with an International filing date of Aug. 4, 2015, which claims the benefit of Chinese Application No. 201510165116.5, filed Apr. 9, 2015, the entire disclosures of which are incorporated herein by reference.

TECHNICAL FIELD

The present disclosure relates to the field of display technology, in particular to a shift register unit, and a gate drive device and a display device using the shift register unit.

BACKGROUND OF THE INVENTION

As a technology related to the existing driving circuit of a liquid crystal display device, GOA (Gate Driver on Array) technology has been developed in the art. A GOA circuit generally includes a plurality of cascaded shift register units, wherein each shift register unit is connected to a shift register unit of an adjacent row, corresponds to a row of gate line, and outputs a gate driving signal and at the same time provides the output signal to the next shift register unit to ensure that the next shift register would implement outputting of the gate driving signal in the next clock cycle.

However in the current GOA technology, a LCD of small size in general has a single-edge GOA structure. But in the single-edge GOA structure, only when there is a signal output at a signal output end of the next shift register unit, the current shift register unit is reset to pull down the signal output end of the current shift register unit to low level. However, such design makes it difficult to guarantee the voltage at the far end of the driving circuit.

SUMMARY OF THE INVENTION

An object of the present disclosure is to provide a shift register unit, and a gate driving device and a display device using the shift register unit, to address the above described disadvantages.

According to one aspect of the present invention, a shift register unit is provided, which includes a pull-up module, an input module, a pull-down control module, a pull-down module, a reset discharging module, a voltage dividing module, a holding module, and a far end pull-down module; wherein the pull-up module is connected to a first clock signal port, a pull-up control node and a signal output end, and configured to pull up a signal outputted from the signal output end to high level according to a potential of the pull-up control node and a clock signal inputted to the first clock signal port, said pull-up control node being a connection point between the pull-up module and the input module; the input module is connected to a signal input end, a second clock signal port and the pull-up control node, and configured to control the potential of the pull-up control node according to a signal inputted to the signal input end and a clock signal at the second clock signal port; the pull-down control module is connected to the second clock signal port, a pull-down control intermediate point and a pull-down control node, and configured to control a potential of the pull-down control node according to a second clock signal and a potential of the pull-down control intermediate point, the pull-down control intermediate point being a connection point between the pull-down control module and the voltage dividing module, and the pull-down control node being a connection point between the pull-down control module and the pull-down module; the pull-down module is connected to the pull-down control node, the pull-up control node, a low level signal and the signal output end, and configured to pull down the potential of the pull-up control node and the signal at the signal output end to low level according to the potential of the pull-down control node; the reset discharging module is connected to a reset signal end, the pull-up control node and the low level signal, and configured to pull down the potential of the pull-up control node to low level according to a signal inputted to the reset signal end; the voltage dividing module is connected to the pull-down control intermediate point, the pull-down control node, the pull-up control node and the low level signal, and configured to control the potential of the pull-down control intermediate point and the potential of the pull-down control node according to the potential of the pull-up control node; the holding module is connected to the second clock signal port, the low level signal and the signal output end, and configured to hold the signal outputted from the output end at low level according to the signal inputted to the second clock signal port; and the far end pull-down module is connected to the far end of the signal output end, the first clock signal port and the second clock signal port, and configured to maintain a potential of the far end of the signal output end at low level according to the signals inputted to the first and second clock signal ports.

Said shift register unit is designed in a split manner in order to perform pull-down compensation to the output signal at the far end, saving the low voltage signal at the far end, and thereby saving the space and facilitating the design.

In an embodiment, said shift register unit may further include a state clearing module configured to clear the state of the pull-down control module.

According to another aspect of the present disclosure, a gate driving device is provided, which includes a plurality of shift register units as described above, wherein said plurality of shift register units are cascaded, and a signal output end of each shift register unit, except for the first shift register unit and the last shift register unit, is connected to an input end of an adjacent next shift register unit and to a reset signal end of an adjacent previous shift register unit; and wherein a frame start signal is inputted to a signal input end of said first shift register unit and a signal output end of said first shift register unit is connected to a signal input end of the second shift register unit, and a signal output end of said last shift register unit is connected to a reset signal end of an adjacent previous shift register unit.

In an embodiment, clock signals inputted to the first clock signal ports of two adjacent shift register units are opposite in phase, and clock signals inputted to the second clock signal ports of two adjacent shift register units are opposite in phase.

According to yet another aspect of the present invention, a display device is provided, which includes the gate driving device as described above.

This Summary is provided to introduce a selection of concepts in a simplified form which are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The above and other aspects of the present invention will be described now in more detail with reference to the drawings showing embodiments of the present invention.

DETAILED DESCRIPTION OF THE INVENTION

Following embodiments are provided by way of example to make the present disclosure exhaustive and complete and to convey the scope of the present invention entirely to persons skilled in the art. The present disclosure is set forth in the context of representative embodiments which are not intended to be restrictive in any way.

Transistors employed in all the embodiments of the present invention may be thin film transistors or field effect transistors or other devices having the same characteristics. In the embodiments of the present invention, the source and drain of each transistor may be used interchangeably and thus for ease of description, one of them is referred to as a first terminal and the other is referred to as a second terminal.

Figure 1:
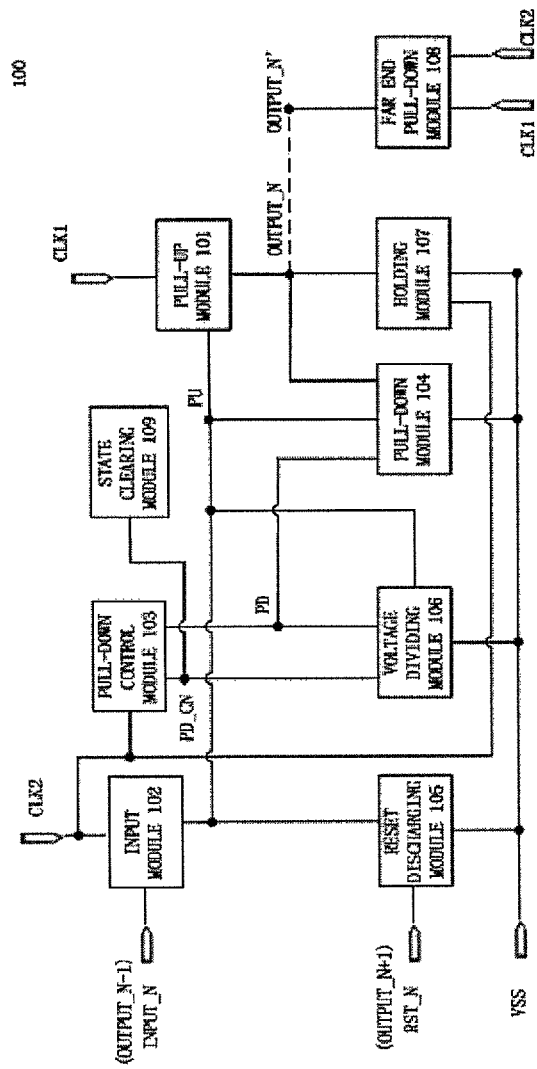
FIG. 1 illustrates a schematic diagram of a shift register unit according to an embodiment of the present disclosure.

FIG. 1 illustrates a schematic diagram of a shift register unit according to an embodiment of the present disclosure. As shown in FIG. 1, the shift register unit 100 includes a pull-up module 101, an input module 102, a pull-down control module 103, a pull-down module 104, a reset discharging module 105, a voltage dividing module 106, a holding module 107, and a far end pull-down module 108. The pull-up module 101 is connected to a first clock signal port CLK1, a pull-up control node (PU) and a signal output end OUTPUT_N (taking the Nth shift register unit in the cascaded structure as an example), and configured to pull up a signal outputted from the signal output end to high level according to a potential of the pull-up control node and a clock signal inputted to the first clock signal port, wherein said pull-up control node is a connection point between the pull-up module and the input module. The input module 102 is connected to a signal input end INPUT_N (which is generally connected to a signal output port OUTPUT_N−1 of the previous shift register unit), a second clock signal port CLK2 and the pull-up control node (PU), and configured to control the potential of the pull-up control node according to a signal inputted to the signal input end and a clock signal at the second clock signal port. The pull-down control module 103 is connected to the second clock signal port, a pull-down control intermediate point (PD_CN) and a pull-down control node (PD), and configured to control a potential of the pull-down control node according to a second clock signal and a potential of the pull-down control intermediate point, wherein the pull-down control intermediate point is a connection point between the pull-down control module and the voltage dividing module 106, and the pull-down control node is a connection point between the pull-down control module and the pull-down module 104.

The pull-down module 104 is connected to the pull-down control node, the pull-up control node, a low level signal VSS and the signal output end, and configured to pull down the potential of the pull-up control node and the signal at the signal output end to low level according to the potential of the pull-down control node. The reset discharging module 105 is connected to a reset signal end RST_N (which is generally connected to a signal output port OUTPUT_N+1 of the next shift register unit), the pull-up control node and the low level signal, and configured to pull down the potential of the pull-up control node to low level according to a signal inputted to the reset signal end. The voltage dividing module 106 is connected to the pull-down control intermediate point, the pull-down control node, the pull-up control node and the low level signal, and configured to control the potential of the pull-down control intermediate point and the potential of the pull-down control node according to the potential of the pull-up control node. The holding module 107 is connected to the second clock signal port, the low level signal and the signal output end, and configured to hold the signal outputted from the output end at low level according to the signal inputted to the second clock signal port. The far end pull-down module 108 is connected to the far end OUTPUT_N' of the signal output end, the first clock signal port and the second clock signal port, and configured to maintain a potential of the far end of the signal output end at low level according to the signals inputted to the first and second clock signal ports. Additionally, the shift register unit may further include a state clearing module 109 which is connected to the pull-down control intermediate point and configured to clear the state of the pull-down control module 103.

Figure 2:
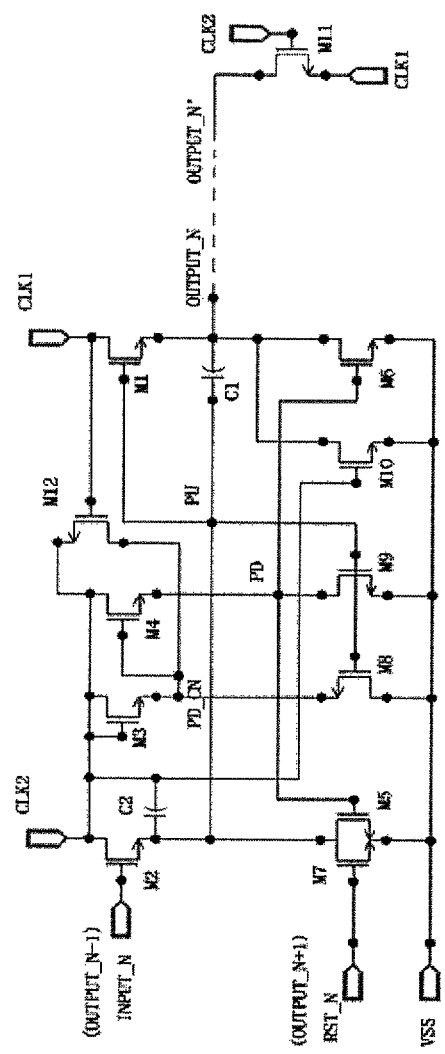
FIG. 2 illustrates a schematic structural diagram of a shift register unit according to an embodiment of the present disclosure.

FIG. 2 illustrates a schematic structural diagram of a shift register unit according to an embodiment of the present disclosure. As shown in FIG. 2, the pull-up module includes: a first transistor M1, wherein a gate of the first transistor M1 is connected to the pull-up control node PU, a first terminal of the first transistor M1 is connected to the first clock signal port CLK1, and a second terminal of the first transistor M1 is connected to the signal output end OUTPUT_N; and a first capacitor C1, wherein one end of the first capacitor C1 is connected to the pull-up control node and the other end of the first capacitor C1 is connected to the signal output end.

The input module includes a second transistor M2, wherein a gate of the second transistor M2 is connected to the signal input end, a first terminal of the second transistor M2 is connected to the second clock signal port CLK2, and a second terminal of the second transistor M2 is connected to the pull-up control node. The input module may further include a second capacitor C2, wherein one end of the second capacitor C2 is connected to the pull-up control node and the other end of the second capacitor C2 is connected to the second clock signal port, to make the coupling effect of the clock signal at the second clock signal port on the PU point and the coupling effect of the clock signal at the first clock signal port on the PU point cancel out each other.

The pull-down control module includes: a third transistor M3, wherein a gate and a first terminal of the third transistor M3 are connected to the second clock signal port, and a second terminal of the third transistor M3 is connected to the pull-down control intermediate point PD_CN; and a fourth transistor M4, wherein a gate of the fourth transistor M4 is connected to the pull-down control intermediate point, a first terminal of the fourth transistor M4 is connected to the second clock signal port, and a second terminal of the fourth transistor M4 is connected to the pull-down control node.

The pull-down module includes: a fifth transistor M5, wherein a gate of the fifth transistor M5 is connected to the pull-down control node, a first terminal of the fifth transistor M5 is connected to the pull-up control node, and a second terminal of the fifth transistor M5 is connected to the low level signal; and a sixth transistor M6, wherein a gate of the sixth transistor M6 is connected to the pull-down control node, a first terminal of the sixth transistor M6 is connected to the signal output end, and a second terminal of the sixth transistor M6 is connected to the low level signal.

The reset discharging module includes a seventh transistor M7, wherein a gate of the seventh transistor M7 is connected to the reset signal end, a first terminal of the seventh transistor M7 is connected to the pull-up control node, and a second terminal of the seventh transistor M7 is connected to the low level signal.

The voltage dividing module includes: an eighth transistor M8, wherein a gate of the eighth transistor M8 is connected to the pull-up control node, a first terminal of the eighth transistor M8 is connected to the low level signal, and a second terminal of the eighth transistor M8 is connected to the pull-down control intermediate point; and a ninth transistor M9, wherein a gate of the ninth transistor M9 is connected to the pull-up control node, a first terminal of the ninth transistor M9 is connected to the pull-down control node, and a second terminal of the ninth transistor M9 is connected to the low level signal.

The holding module includes a tenth transistor M10, wherein a gate of the tenth transistor M10 is connected to the second clock signal port, a first terminal of the tenth transistor M10 is connected to the signal output end, and a second terminal of the tenth transistor M10 is connected to the low level signal.

The far end pull-down module includes an eleventh transistor M11, wherein a gate of the eleventh transistor M11 is connected to the second clock signal port, a first terminal of the eleventh transistor M11 is connected to the far end of the signal output end, and a second terminal of the eleventh transistor M11 is connected to the first clock signal port.

Additionally, the shift register unit may further includes a state clearing module which may includes a twelfth transistor M12, wherein a gate of the twelfth transistor M12 is connected to the first clock signal port, a first terminal of the twelfth transistor M12 is connected to the pull-down control intermediate point, and a second terminal of the twelfth transistor M12 is connected to the second clock signal port.

The circuit structure as shown in FIG. 2 is explained by taking P-type transistors as an example; however, based on the description and teachings on the implementation with P-type transistors, implementations with N-type transistor can also be readily devised by persons skilled in the art without any inventive effort, all these implementations falling within the scope of the present invention. Accordingly, it should be noted that the structures of the various modules as described above are merely exemplary rather than restrictive, and any structures that may carry out the functions of the above described modules are contemplated.

Figure 3:
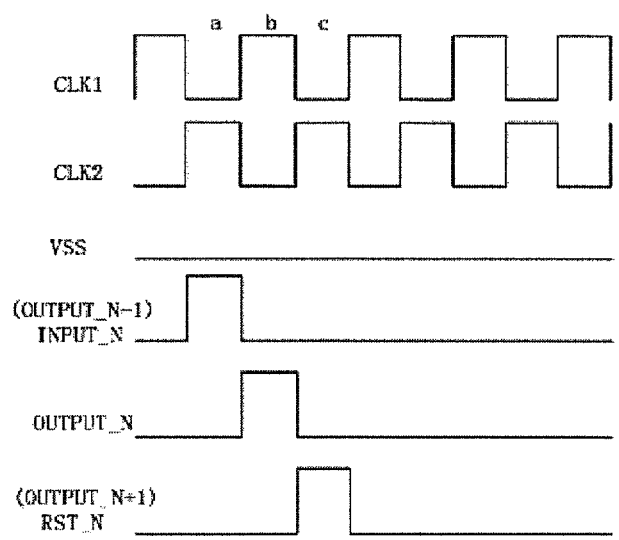
FIG. 3 illustrates a signal sequence diagram of a shift register unit according to an embodiment of the present disclosure.

FIG. 3 illustrates a signal sequence diagram of a shift register unit according to an embodiment of the present disclosure. For the purpose of making the description of the present disclosure more exhaustive, now description is made in connection with the exemplary structural diagram of FIG. 2.

As shown in FIG. 3, the clock signal inputted to the first clock signal port and the clock signal inputted to the second clock signal port are opposite in phase. At stage a, the CLK1 end is at low level, the CLK2 end is at high level, there is a signal input at the signal input end INPUT_N (i.e. the port is at high level), and there is no signal input at the reset signal end REST_N (the port is at low level). It should be noted that the signal input end INPUT_N is generally connected to the signal output end of the previous shift register unit (OUTPUT_N−1). At this point, the second transistor M2 is turned on to charge the first capacitor C1, and thus the potential of the PU point is controlled at high level. This causes M8 and M9 in the voltage dividing circuit to be turned on, such that the potentials of the pull-down control intermediate point (PD_CN) and the pull-down control node (PD) are controlled at low level, thereby making the pull-down control module inactive (M4 is cutoff) and the pull-down module inactive (M5 and M6 are cutoff). At this point, M10 in the holding module is turned on due to the presence of signal input at the CLK2 end, such that the signal outputted from the signal output end is held at low level. M11 in the far end pull-down module is also turned on to maintain the potential of the far end of the signal output end at low level.

At stage b, the CLK1 end is at high level, the CLK2 end is at low level, there is no signal input at the signal input end, and there is no signal input at the reset signal end either. At this point, since the first capacitor C1 has already been charged in stage a and the potential of the PU point is thus at high level, the first transistor M1 of the pull-up module is turned on, such that the signal outputted from the signal output end is pulled up to high level. The signal output end may be connected to a gate of a pixel region in order to provide it with a gate driving signal. It is noted that due to the coupling effect of the capacitor, the potential of the PU point will rise continuously, such that the potentials of the pull-down control intermediate point (PD_CN) and the pull-down control node (PD) may remain at low level and the pull-down control module and the pull-down module continue to be inactive.

At stage c, the CLK1 end is at low level, the CLK2 end is at high level, there is no signal input at the signal input end, but there is a signal input at the reset signal end, this is because there is a signal output at the signal output end (OUTPUT_N+1) of an adjacent next shift register unit. At this point, M7 in the reset discharging module is turned on, such that the left end of C1 is discharged and the potential of the PU point changes to be low level, thereby making the voltage dividing module inactive (M8 and M9 are cutoff). Meanwhile, M3 of the pull-down control module is turned on such that the pull-down control intermediate point (PD_CN) changes to be at high level, and in turn M4 is also turned on such that the potential of the pull-down control node (PD) changes to be high level. In this way, the pull-down module works (M5 and M6 are turned on), and both the left end and the right end of C1 are discharged, so that the potential of the pull-up control node and the signal at the signal output end become to be low level. At this point, the potential of the far end of the signal output end is maintained at low level by the far end pull-down module, in order to keep the circuit stable.

At subsequent stages, the CLK1 end and the CLK2 end are at high level alternately, no signal is inputted at the signal input end and the reset signal end of this shift register unit, and no signal is outputted at the signal output end, until a new signal comes to the signal input end, then the above stages a-c are repeated.

Additionally, considering the presence of the capacitor C1, the input module may further include a second capacitor C2, wherein one end of the second capacitor C2 is connected to the pull-up control node PU and the other end of the second capacitor C2 is connected to the second clock signal port CLK2, such that the coupling effect of the clock signal at the CLK1 end on the PU point may cancel out the coupling effect of the clock signal at the CLK2 end on the PU point. In this way, the stability of the shift register unit circuit is greatly enhanced.

In a case where no new signal comes from the signal input end, the far end potential of the signal output end is pulled down to low level by the far end pull-down module whenever the CLK2 end is at low level, in order to maintain the level of the far end at low level. This enables to guarantee the low level of the far end of the driver circuit, and avoids the need of adding additional Vss signal at the far end, making the circuit design more simple and effective. Meanwhile, the potentials of the PD point and PD_CN point are also high level, and the pull-down module functions to pull down the signal output end to low level to keep the circuit stable. In fact, at subsequent stages, since the potentials of the PD point and the PD_CN point is not set to low level, they will be held at high level, so that M4 in the pull-down control module will be kept at on state and the pull-down module is kept at active state, until a new signal comes to the signal input end. For the purpose of mitigating the problem of shortened lifetime caused by the high power consumption of M4, the state clearing module may set the potential of the PD_CN point to low level when the CLK1 end is at high level (at this point, M12 is turned on) to cutoff M4 in order to expand its lifetime without affecting the implementation of the functions of the circuit.

Figure 4:
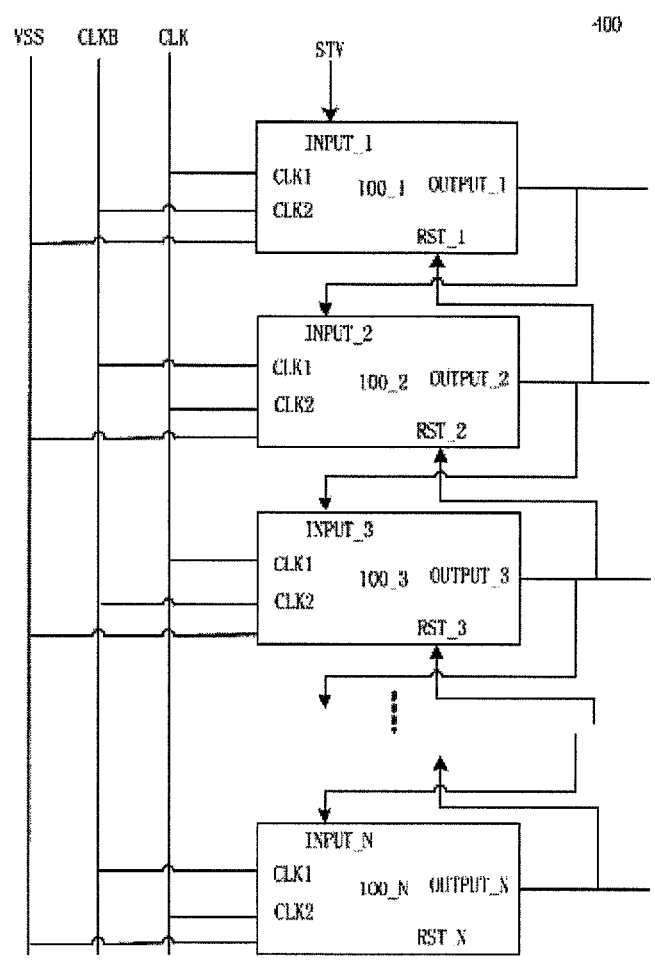
FIG. 4 illustrates a schematic structural diagram of a gate driving device according to an embodiment of the present disclosure.

FIG. 4 illustrates a schematic structural diagram of a gate driving device according to an embodiment of the present disclosure. As shown in FIG. 4, the gate driving device 400 includes a plurality of shift register units 100_1, ..., 100_N, wherein each of them may have the same structure as the shift register unit of FIG. 1. The plurality of shift register units are cascaded with each other, and a signal output end of each shift register unit, except for the first shift register unit 100_1 and the last shift register unit 100_N, is connected to an input end of an adjacent next shift register unit and to a reset signal end of an adjacent previous shift register unit. A frame start signal STV is inputted to a signal input end of said first shift register unit and a signal output end of said first shift register unit is connected to a signal input end of the second shift register unit. A signal to output end of said last shift register unit is connected to a reset signal end of an adjacent previous shift register unit. The first voltage source CLK and the second voltage source CLKB as shown in FIG. 4 are opposite in phase, and thus the clock signals inputted to the first clock signal ports of two adjacent shift register units are opposite in phase, and clock signals inputted to the second clock signal ports of two adjacent shift register units are opposite in phase.

Likewise, there is disclosed a display device including the above described gate driving device.

In view of many possible embodiments in which the principles of the disclosed invention may be applied, it should be appreciated that the illustrated embodiments are merely preferred instances of the present invention and should not be considered as limiting the scope of the present invention. In contrast, the scope of the present invention is defined by the following claims. Therefore we claim all those fall within the scope of these claims and their equivalents as our invention.

The invention claimed is:

1. A shift register unit comprising:
   a pull-up module;
   an input module;
   a pull-down control module;
   a pull-down module;
   a reset discharging module;
   a voltage dividing module;
   a holding module;
   and a far end pull-down module; wherein
   the pull-up module is connected to a first clock signal port, a pull-up control node and a signal output end, and configured to pull up a signal outputted from the signal output end to high level according to a potential of the pull-up control node and a clock signal inputted to the first clock signal port, said pull-up control node being a connection point between the pull-up module and the input module;
   the input module is connected to a signal input end, a second clock signal port and the pull-up control node, and configured to control the potential of the pull-up control node according to a signal inputted to the signal input end and a clock signal at the second clock signal port;
   the pull-down control module is connected to the second clock signal port, a pull-down control intermediate point and a pull-down control node, and configured to control a potential of the pull-down control node according to a second clock signal and a potential of the pull-down control intermediate point, the pull-down control intermediate point being a connection point between the pull-down control module and the voltage dividing module, and the pull-down control node being a connection point between the pull-down control module and the pull-down module;
   the pull-down module is connected to the pull-down control node, the pull-up control node, a low level signal and the signal output end, and configured to pull down the potential of the pull-up control node and the signal at the signal output end to low level according to the potential of the pull-down control node;
   the reset discharging module is connected to a reset signal end, the pull-up control node and the low level signal, and configured to pull down the potential of the pull-up control node to low level according to a signal inputted to the reset signal end;
   the voltage dividing module is connected to the pull-down control intermediate point, the pull-down control node, the pull-up control node and the low level signal, and configured to control the potential of the pull-down control intermediate point and the potential of the pull-down control node according to the potential of the pull-up control node;
   the holding module is connected to the second clock signal port, the low level signal and the signal output end, and configured to hold the signal outputted from the output end at low level according to the signal inputted to the second clock signal port; and
   the far end pull-down module is connected to a far end of the signal output end, the first clock signal port and the second clock signal port, and configured to maintain a potential of the far end of the signal output end at low level according to the signals inputted to the first and second clock signal ports;
   wherein said input module comprises a second transistor, and wherein a gate of the second transistor is connected to the signal input end, a first terminal of the second transistor is connected to the second clock signal port, and a second terminal of the second transistor is connected to the pull-up control node.

2. The shift register unit according to claim 1, said pull-up module comprises:
   a first transistor, wherein a gate of the first transistor is connected to the pull-up control node, a first terminal of the first transistor is connected to the first clock signal port, and a second terminal of the first transistor is connected to the signal output end; and
   a first capacitor, wherein one end of the first capacitor is connected to the pull-up control node and the other end of the first capacitor is connected to the signal output end.

3. The shift register unit according to claim 1, said pull-down control module comprises:
   a third transistor, wherein a gate and a first terminal of the third transistor are connected to the second clock signal port, and a second terminal of the third transistor is connected to the pull-down control intermediate point; and
   a fourth transistor, wherein a gate of the fourth transistor is connected to the pull-down control intermediate point, a first terminal of the fourth transistor is connected to the second clock signal port, and a second terminal of the fourth transistor is connected to the pull-down control node.

4. The shift register unit according to claim 1, said pull-down module comprises:
   a fifth transistor, wherein a gate of the fifth transistor is connected to the pull-down control node, a first terminal of the fifth transistor is connected to the pull-up control node, and a second terminal of the fifth transistor is connected to the low level signal; and
   a sixth transistor, wherein a gate of the sixth transistor is connected to the pull-down control node, a first terminal of the sixth transistor is connected to the signal output end, and a second terminal of the sixth transistor is connected to the low level signal.

5. The shift register unit according to claim 1, said reset discharging module comprises a seventh transistor, wherein a gate of the seventh transistor is connected to the reset signal end, a first terminal of the seventh transistor is connected to the pull-up control node, and a second terminal of the seventh transistor is connected to the low level signal.

6. The shift register unit according to claim 1, said voltage dividing module comprises:
   an eighth transistor, wherein a gate of the eighth transistor is connected to the pull-up control node, a first terminal of the eighth transistor is connected to the low level signal, and a second terminal of the eighth transistor is connected to the pull-down control intermediate point; and
   a ninth transistor, wherein a gate of the ninth transistor is connected to the pull-up control node, a first terminal of the ninth transistor is connected to the pull-down control node, and a second terminal of the ninth transistor is connected to the low level signal.

7. The shift register unit according to claim 1, said holding module comprises a tenth transistor, wherein a gate of the tenth transistor is connected to the second clock signal port, a first terminal of the tenth transistor is connected to the signal output end, and a second terminal of the tenth transistor is connected to the low level signal.

8. The shift register unit according to claim 1, said far end pull-down module comprises an eleventh transistor, wherein a gate of the eleventh transistor is connected to the second clock signal port, a first terminal of the eleventh transistor is connected to the far end of the signal output end, and a second terminal of the eleventh transistor is connected to the first clock signal port.

9. The shift register unit according to claim 1, said input module comprises a second capacitor, wherein one end of the second capacitor is connected to the pull-up control node and the other end of the second capacitor is connected to the second clock signal port.

10. The shift register unit according to claim 1, further comprises a state clearing module which is connected to the pull-down control intermediate point and configured to clear the state of the pull-down control module.

11. The shift register unit according to claim 9, said state clearing module comprises a twelfth transistor, wherein a gate of the twelfth transistor is connected to the first clock signal port, a first terminal of the twelfth transistor is connected to the pull-down control intermediate point, and a second terminal of the twelfth transistor is connected to the second clock signal port.

12. The shift register unit according to claim 1, said input module comprises a second capacitor, wherein one end of the second capacitor is connected to the pull-up control node and the other end of the second capacitor is connected to the second clock signal port.

13. A gate driving device comprising a plurality of shift register units of claim 1,
   wherein said plurality of shift register units are cascaded, and a signal output end of each shift register unit, except for the first shift register unit and the last shift register unit, is connected to an input end of an adjacent next shift register unit and to a reset signal end of an adjacent previous shift register unit; and
   wherein a frame start signal is inputted a signal input end of said first shift register unit and a signal output end of said first shift register unit is connected to a signal input end of the second shift register unit, and a signal output end of said last shift register unit is connected to a reset signal end of an adjacent previous shift register unit.

14. The gate driving device of claim 13, wherein clock signals inputted to the first clock signal ports of two adjacent shift register units are opposite in phase, and clock signals inputted to the second clock signal ports of two adjacent shift register units are opposite in phase.

15. A display device comprising the gate driving device of claim 13.

16. A display device comprising the gate driving device of claim 14.

* * * * *